United States Patent
Tomita et al.

(10) Patent No.: US 10,763,333 B2
(45) Date of Patent: Sep. 1, 2020

(54) NITRIDE SEMICONDUCTOR DEVICE AND METHOD OF MANUFACTURING NITRIDE SEMICONDUCTOR DEVICE

(71) Applicant: KABUSHIKI KAISHA TOYOTA CHUO KENKYUSHO, Nagakute-shi, Aichi (JP)

(72) Inventors: Kazuyoshi Tomita, Nagakute (JP); Tetsuo Narita, Nagakute (JP)

(73) Assignee: KABUSHIKI KAISHA TOYOTA CHUO KENKYUSHO, Nagakute-Shi (JP)

( * ) Notice: Subject to any disclaimer, the term of this patent is extended or adjusted under 35 U.S.C. 154(b) by 0 days.

(21) Appl. No.: 16/285,944

(22) Filed: Feb. 26, 2019

(65) Prior Publication Data
US 2019/0305090 A1   Oct. 3, 2019

(30) Foreign Application Priority Data

Apr. 2, 2018  (JP) .................................. 2018-070915

(51) Int. Cl.
*H01L 29/872*  (2006.01)
*H01L 21/02*  (2006.01)
(Continued)

(52) U.S. Cl.
CPC ...... *H01L 29/2003* (2013.01); *H01L 21/0262* (2013.01); *H01L 29/66136* (2013.01);
(Continued)

(58) Field of Classification Search
CPC ............. H01L 29/2003; H01L 29/8611; H01L 29/872; H01L 21/0262; H01L 29/66136; H01L 29/66143
(Continued)

(56) References Cited

U.S. PATENT DOCUMENTS

| 2012/0313108 | A1  | 12/2012 | Tsuchiya et al. | |
|---|---|---|---|---|
| 2013/0137225 | A1* | 5/2013 | Bour et al. | H01L 21/0254 438/192 |
| 2017/0077218 | A1* | 3/2017 | Nishikawa et al. | H01L 29/0619 |
| 2018/0182882 | A1* | 6/2018 | Hashimoto et al. | H01L 29/7788 |

(Continued)

FOREIGN PATENT DOCUMENTS

| JP | 2007-059719 A | 3/2007 |
|---|---|---|
| JP | 2012-256698 A | 12/2012 |

(Continued)

OTHER PUBLICATIONS

Hiroshi Ohta et al., "Vertical GaN p-n Junction Diodes with High Breakdown Voltage Over 4 kV" IEEE Electron Device Letters, vol. 36., No. 11, 2015. pp. 1180-1182.

(Continued)

*Primary Examiner* — Thinh T Nguyen
(74) *Attorney, Agent, or Firm* — Oliff PLC

(57) ABSTRACT

A nitride semiconductor device may comprise a p-type layer. The nitride semiconductor device may comprise a first n-type voltage-blocking layer in contact with the p-type layer. The nitride semiconductor device may comprise a second n-type voltage-blocking layer in contact with the first n-type voltage-blocking layer and separated from the p-type layer by the first n-type voltage-blocking layer. A donor concentration in the first n-type voltage-blocking layer may be lower than a donor concentration in the second n-type voltage-blocking layer. A carbon concentration in the first n-type voltage-blocking layer may be lower than a carbon concentration in the second n-type voltage-blocking layer.

9 Claims, 6 Drawing Sheets

(51) Int. Cl.
  *H01L 29/78*  (2006.01)
  *H01L 29/20*  (2006.01)
  *H01L 29/861*  (2006.01)
  *H01L 29/66*  (2006.01)

(52) U.S. Cl.
  CPC .. *H01L 29/66143* (2013.01); *H01L 29/66681* (2013.01); *H01L 29/7813* (2013.01); *H01L 29/8611* (2013.01); *H01L 29/872* (2013.01)

(58) Field of Classification Search
  USPC ........ 257/212, 213, 219, 220; 438/137, 138, 438/141
  See application file for complete search history.

(56) References Cited

U.S. PATENT DOCUMENTS

| | | | |
|---|---|---|---|
| 2019/0198621 A1* | 6/2019 | Lutz et al. | .......... H01L 29/1608 |
| 2020/0127101 A1 | 4/2020 | Narita | |

FOREIGN PATENT DOCUMENTS

| | | |
|---|---|---|
| JP | 2015-185576 A | 10/2015 |
| JP | 2017-183583 A | 10/2017 |

OTHER PUBLICATIONS

Jun. 9, 2020 Office Action issued in Japanese Patent Application No. 2018-070915.

\* cited by examiner

NITRIDE SEMICONDUCTOR DEVICE AND METHOD OF MANUFACTURING NITRIDE SEMICONDUCTOR DEVICE

CROSS-REFERENCE

This application claims priority to Japanese patent application No. 2018-070915, filed on Apr. 2, 2018. the entire contents of which are incorporated herein by reference.

TECHNICAL FIELD

The technique disclosed herein relates to a nitride semiconductor device and a method of manufacturing a nitride semiconductor device.

BACKGROUND

"Vertical GaN p-n Junction Diodes With High Breakdown Voltage Over 4 kV", Hiroshi Ohta et al. IEEE ELECTRON DEVICE LETTERS, Vol. 36, No. 11 (2015). pages 1180 to 1182 describes a technique that divides an n-type drift layer being a voltage-blocking layer into two or more layers. and sets a donor concentration in the n-type drift layer in contact with a p-type layer lower than a donor concentration in an n-type drift layer that is not in contact with the p-type layer. This configuration allows an electric field generated in a pn junction between the p-type layer and the n-type drift layer to be alleviated.

SUMMARY

When the donor concentration in the n-type drift layer is simply reduced, the number of free electrons compensated by acceptor-like defects becomes nonignorable, and an on-resistance of a semiconductor device increases. Such acceptor-like defects are hereinafter referred to as "the compensating acceptors". Further, if a deposition condition that can reduce residual carbon. which is a primary cause generating the compensating acceptors. is applied to the n-type drift layer, a deposition speed of the n-type drift layer is slowed, and throughput is thereby deteriorated significantly.

One technique disclosed in the present application is a nitride semiconductor device. The nitride semiconductor device may comprise a p-type layer. The nitride semiconductor device may comprise a first n-type voltage-blocking layer in contact with the p-type layer. The nitride semiconductor device may comprise a second n-type voltage-blocking layer in contact with the first n-type voltage-blocking layer and separated from the p-type layer by the first n-type voltage-blocking layer. A donor concentration in the first n-type voltage-blocking layer may be lower than a donor concentration in the second n-type voltage-blocking layer. A carbon concentration in the first n-type voltage-blocking layer may be lower than a carbon concentration in the second n-type voltage-blocking layer.

DETAILED DESCRIPTION

Figure 1:
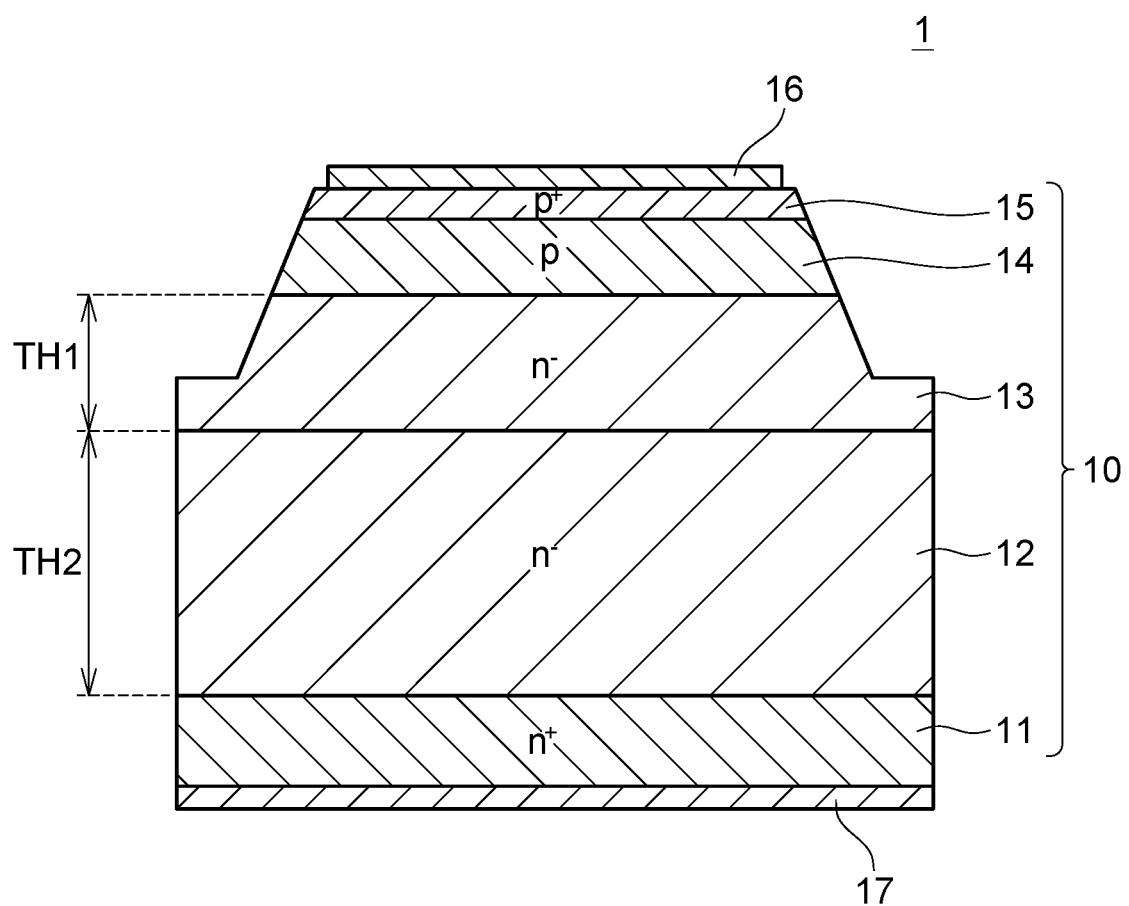
FIG. 1 is a schematic cross-sectional view of a semiconductor device 1 according to a first embodiment.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved nitride semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims. may be combined in ways that are not specifically and explicitly enumerated in order to provide additional useful embodiments of the present teachings.

All features disclosed in the description and/or the claims are intended to be disclosed separately and independently from each other for the purpose of original written disclosure. as well as for the purpose of restricting the claimed subject matter. independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

One technique disclosed in the present application is a nitride semiconductor device. The nitride semiconductor device may comprise a p-type layer. The nitride semiconductor device may comprise a first n-type voltage-blocking layer in contact with the p-type layer. The nitride semiconductor device may comprise a second n-type voltage-blocking layer in contact with the first n-type voltage-blocking layer and separated from the p-type layer by the first n-type voltage-blocking layer. A donor concentration in the first n-type voltage-blocking layer may be lower than a donor concentration in the second n-type voltage-blocking layer. A carbon concentration in the first n-type voltage-blocking layer may be lower than a carbon concentration in the second n-type voltage-blocking layer.

An electric field is concentrated at a greatest degree in a pn junction between the p-type layer and the first n-type voltage-blocking layer. The nitride semiconductor device disclosed herein can increase a blocking voltage in the pn junction due to its donor concentration in the first n-type voltage-blocking layer being lower than the donor concentration in the second n-type voltage-blocking layer. Further, since the carbon concentration in the first n-type voltage-blocking layer is lower than the carbon concentration in the second n-type voltage-blocking layer, electron compensation by the compensating acceptors occurs less in the first n-type voltage-blocking layer than in the second n-type voltage-blocking layer. Thus, a situation in which an on-resistance of the first n-type voltage-blocking layer increases despite having set the donor concentration in the first n-type voltage-blocking layer lower than the donor concentration of the second n-type voltage-blocking layer can be avoided. Further, since the carbon concentration in the second n-type voltage-blocking layer is higher than the carbon concentration in the first n-type voltage-blocking layer, a growth speed of the second n-type voltage-blocking layer can be increased faster than a growth speed of the first n-type voltage-blocking layer. A manufacturing time of the nitride semiconductor device can be shortened.

The carbon concentration in the first n-type voltage-blocking layer may be constant at a first concentration. The carbon concentration in the second n-type voltage-blocking layer may be constant at a second concentration. The first concentration may be lower than the second concentration.

The carbon concentration in the first n-type voltage-blocking layer may become higher as a distance from an interface between the first n-type voltage-blocking layer and the p-type layer increases.

An E3 electron trap concentration in the first n-type voltage-blocking layer may be lower than the carbon concentration in the first n-type voltage-blocking layer. An E3 electron trap concentration in the second n-type voltage-blocking layer may be lower than the carbon concentration in the second n-type voltage-blocking layer.

A thickness of the second n-type voltage-blocking layer may be thicker than a thickness of the first n-type voltage-blocking layer.

One technique disclosed in the present application is a method of manufacturing a nitride semiconductor device provided with a p-type layer, a first n-type voltage-blocking layer, and a second n-type voltage-blocking layer. The method may comprise forming the second n-type voltage-blocking layer on a nitride semiconductor substrate by an epitaxial growth method. The method may comprise forming the first n-type voltage-blocking layer in contact with the second n-type voltage-blocking layer by the epitaxial growth method. The method may comprise forming the p-type layer in contact with the first n-type voltage-blocking layer and separated from the second n-type voltage-blocking layer by the first n-type voltage-blocking layer. A growth rate of the second n-type voltage-blocking layer may be higher than a growth rate of the first n-type voltage-blocking layer.

The epitaxial growth method may be a metalorganic vapor growth method. A V/III ratio in growing the second n-type voltage-blocking layer may be lower than a V/III ratio in growing the first n-type voltage-blocking layer.

First Embodiment (Configuration of Semiconductor Device 1)

FIG. 1 shows a schematic cross-sectional view of a semiconductor device 1 according to a first embodiment. The semiconductor device 1 is a gallium nitride (GaN) vertical pn junction power diode. The semiconductor device 1 includes a GaN semiconductor substrate 10. The semiconductor substrate 10 has a laminate structure in which a buffer layer 11, a second drift layer 12, a first drift layer 13, a p-type layer 14, and a contact layer 15 are laminated.

The buffer layer 11 is an $n^+$-type GaN substrate. The second drift layer 12 and the first drift layer 13 are epitaxially-grown $n^-$-type GaN layers. The p-type layer 14 is a p-type GaN layer epitaxially grown on the first drift layer 13. The first drift layer 13 is in contact with the p-type layer 14. The second drift layer 12 is in contact with the first drift layer 13 and is separated from the p-type layer 14 by the first drift layer 13. A thickness TH2 of the second drift layer 12 is thicker than a thickness TH1 of the first drift layer 13.

The second drift layer 12 and the first drift layer 13 are layers for maintaining a blocking voltage of the semiconductor device 1. On the other hand, the buffer layer 11 does not serve a function to maintain the blocking voltage. As such, in the semiconductor device 1, the first drift layer 13 and the second drift layer 12 are clearly distinguished from the buffer layer 11. That is, when a reverse bias voltage is applied to the semiconductor device 1, a depletion layer spreads in at least a part of the first drift layer 13 and the second drift layer 12, however, a depletion layer does not spread in the buffer layer 11.

A donor concentration (Si concentration) in the first drift layer 13 is lower than a donor concentration in the second drift layer 12. In the first embodiment, the donor concentration of the first drift layer 13 is set to 8E15 cm$^{-3}$. and the donor concentration of the second drift layer 12 is set to 2E16 cm$^{-3}$.

A carbon concentration in the first drift layer 13 is constant at a first concentration. A carbon concentration in the second drift layer 12 is constant at a second concentration. Further, the first concentration is lower than the second concentration. In the first embodiment, the first concentration of carbon in the first drift layer 13 is set to 3E15 cm$^{-3}$, and the second concentration of carbon in the second drift layer 12 is set to 5E15 cm$^3$.

Further, the carbon concentration in the first drift layer 13 is lower than the donor concentration (Si concentration) in the first drift layer 13. Similarly, the carbon concentration in the second drift layer 12 is lower than the donor concentration (Si concentration) in the second drift layer 12. For example, the carbon concentration is equal to or less than 30% relative to the donor concentration. By configuring as above, an effective donor concentration can be increased. Thus, the first drift layer 13 and the second drift layer 12 can be functioned as n-type GaN.

An E3 electron trap concentration in the first drift layer 13 is lower than the carbon concentration in the first drift layer 13. An E3 electron trap is a trap having an energy level of 0.6 eV from a conduction band minimum. Similarly, an E3 electron trap concentration in the second drift layer 12 is lower than the carbon concentration in the second drift layer 12. In the first embodiment, the E3 electron trap concentration in the first drift layer 13 is set to 1E15 cm$^3$. and the E3 electron trap concentration in the second drift layer 12 is set to 5E14 cm$^3$.

The contact layer 15 is a $p^+$-type GaN layer epitaxially grown on the p-type layer 14. In the first embodiment, an acceptor impurity concentration in the p-type layer 14 is set to 5E17 cm$^3$. and an impurity concentration contact layer 15 is set to 8E19 cm$^3$. An anode electrode 16 is provided on an upper surface of the contact layer 15. A cathode electrode 17 is provided on a bottom surface of the buffer layer 11.

(Manufacturing Method of Semiconductor Device 1)

Figure 2:
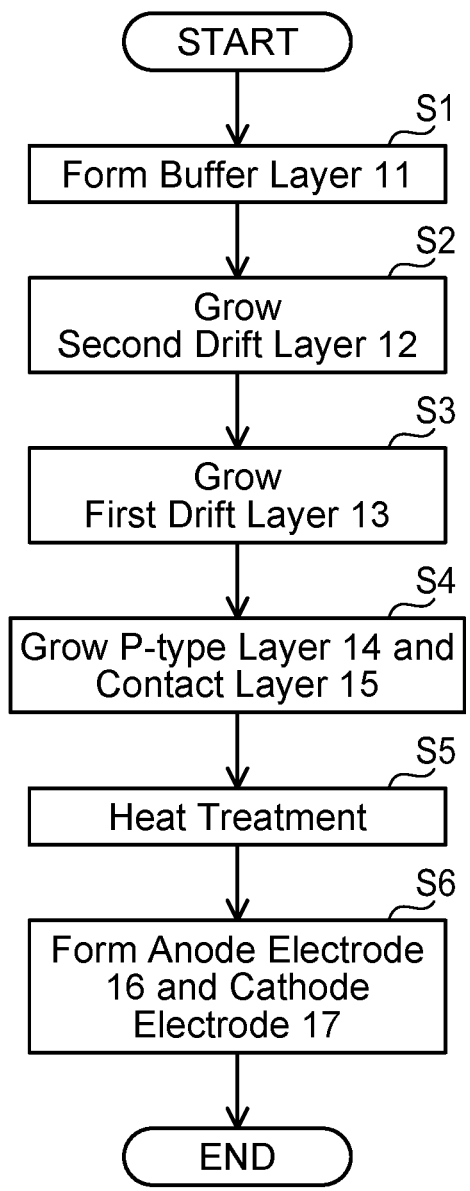
FIG. 2 is a flowchart showing a method of manufacturing the semiconductor device 1 according to the first embodiment.

A manufacturing method of the semiconductor device 1 will be described with reference to a flowchart of FIG. 2. A metalorganic vapor epitaxial growth method (MOVPE) having an excellent controllability of film thickness and dopant is used as a deposition method. Trimethylgallium (TMGa) is used as a Ga material. Ammonia gas (NH$_3$) is used as an N material. Monomethyl silane (MMSi) gas is used as an n-type dopant. Bis(cyclopentadienyl)magnesium (Cp2Mg) is used as a p-type dopant.

In step S1, the buffer layer 11 is formed. Specifically, an n-type gallium nitride substrate is prepared and introduced to a reactor of a MOVPE equipment. It is heated to 1000° C. in a mixed gas atmosphere of hydrogen, nitrogen, and ammonia to perform thermal cleaning thereon. After this, it is heated to 1020° C., and TMGa and MMSi gas are supplied. Due to this, the buffer layer 11 being high-concentration n-type GaN can be grown by 0.1 to 0.5 micrometers.

In step S2, the second drift layer 12 being n-type GaN is grown on the buffer layer 11.

In step S3, the first drift layer 13 being n-type GaN is grown on the second drift layer 12.

The donor concentration (Si concentration) of the second drift layer 12 is set higher than the donor concentration of the first drift layer 13. This can be implemented by setting a ratio of a MMSi gas supply molar flow rate relative to a TMGa supply molar flow rate (Si/Ga supply molar ratio) for growing the second drift layer 12 higher than the Si/Ga ratio for growing the first drift layer 13.

Further, a V/III ratio for growing the second drift layer 12 is set lower than a V/III ratio for growing the first drift layer 13. "Setting the V/III ratio low" means that a material supply amount of TMGa is increased in a supply molar ratio (V/III ratio) of $NH_3$ and TMGa. For example, the V/III ratio can be set low by setting a TMGa supply amount high under a constant ammonia gas concentration.

Figure 3:
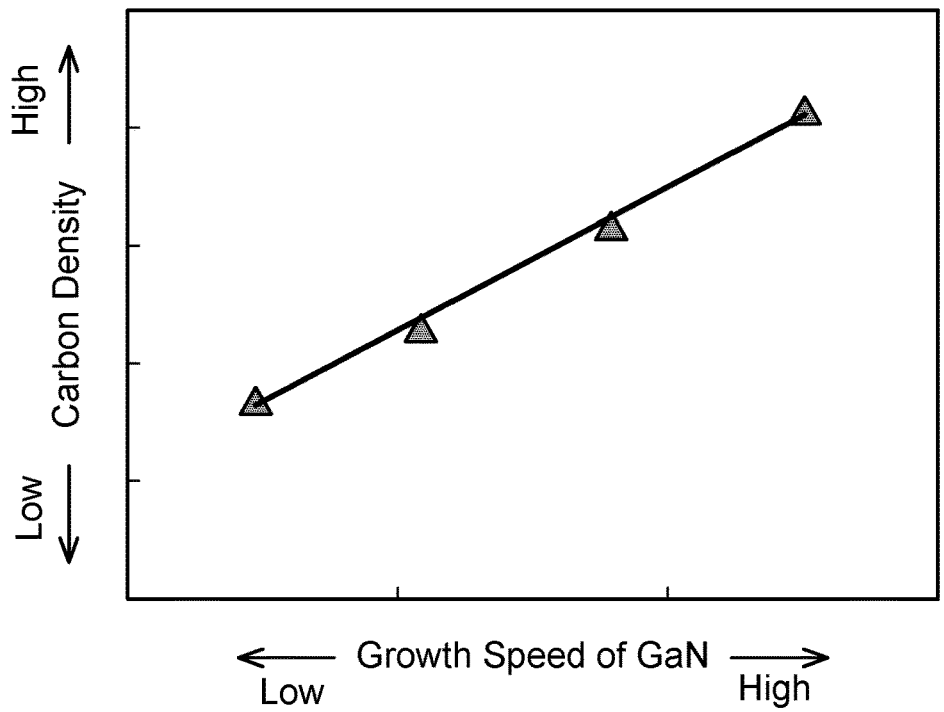
FIG. 3 is a graph showing a relationship between a carbon concentration and a GaN growth speed.

Due to this, as a first effect, a growth speed of the second drift layer 12 can be made faster than a growth speed of the first drift layer 13. Further, as a second effect, the concentration of carbon contained in the first drift layer 13 can be made lower than the concentration of carbon contained in the second drift layer 12. Reasons therefor will be described. In FIG. 3, a horizontal axis is a growth speed of GaN, and a vertical axis is a carbon concentration which GaN acquires. The growth speed of GaN increases linearly relative to the TMGa material supply amount. When the supply molar ratio (V/III ratio) of $NH_3$ and TMGa is small, that is, when the TMGa material supply amount is large, the growth speed increases. It can be understood from FIG. 3 that the carbon concentration acquired by GaN increases linearly relative to the increase in the growth speed of GaN. This is due to TMGa having a stoichiometric composition of $Ga(CH_3)_3$, which contains carbon. That is, the growth speed of GaN increases linearly relative to the increase in the supply amount of the material (TMGa), at the same time as which the carbon concentration which GaN acquires from TMGa increases linearly.

Further, a growth pressure for growing the second drift layer 12 and the first drift layer 13 is set to a predetermined pressure (e.g., 500 Torr) or greater. Due to this, the E3 electron trap concentration can be set lower than the carbon concentration in the second drift layer 12, and the E3 electron trap concentration can be set lower than the carbon concentration in the first drift layer 13.

In step S4, TMGa and Cp2Mg are supplied to the reactor and the p-type layer 14 and the contact layer 15 are grown in this order.

In step S5, heat treatment is performed under nitrogen atmosphere at 750° C. or higher. By doing so, magnesium, which is an acceptor element, can be activated.

In step S6, the p-type layer in areas other than a diode region is removed by a known photolithography technique and dry etching process. The anode electrode 16 and the cathode electrode 17 are formed, and heat treatment is performed. Due to this, the semiconductor device 1 shown in FIG. 1 is completed.

(Effects)

In a high voltage-resistance nitride semiconductor device using a pn junction, a highest electric field is applied to an n-type drift layer that is in contact with a p-type layer. For example, in the semiconductor device 1 (pn diode) shown in FIG. 1, it is the first drift layer 13 that is applied with the highest electric field in an event where the reverse bias voltage is applied in an off state. As such, the donor densities in the n-type drift layers that ensure the blocking voltage need to be maintained low. That is, in a high voltage-resistance nitride semiconductor device, the effective donor densities (Nd—Na) in the n-type drift layers need to be controlled. In order to control an effective donor concentration, not only a concentration (Nd) of donor impurity atoms (silicon atoms) but also an acceptor concentration (Na) that compensates electrons need to be controlled. This is because an on-resistance increases when the compensating acceptor concentration is high. Causes of acceptor generation are residual carbon and the E3 electron trap.

There are three problems in increasing the blocking voltage by lowering the donor concentration in the n-type drift layer. As the first problem, if the donor concentration of the n-type drift layer is simply reduced, electron compensation by the compensating acceptors becomes nonignorable, and an on-resistance of the semiconductor device increases.

As the second problem, if the concentration of residual carbon, being one of the primary causes of the compensating acceptors, is reduced, the growth speed of the n-type drift layer becomes slow and throughput is thereby deteriorated. This is because there is a positive correlation between the carbon concentration and the GaN growth speed as shown in FIG. 3.

Figure 4:
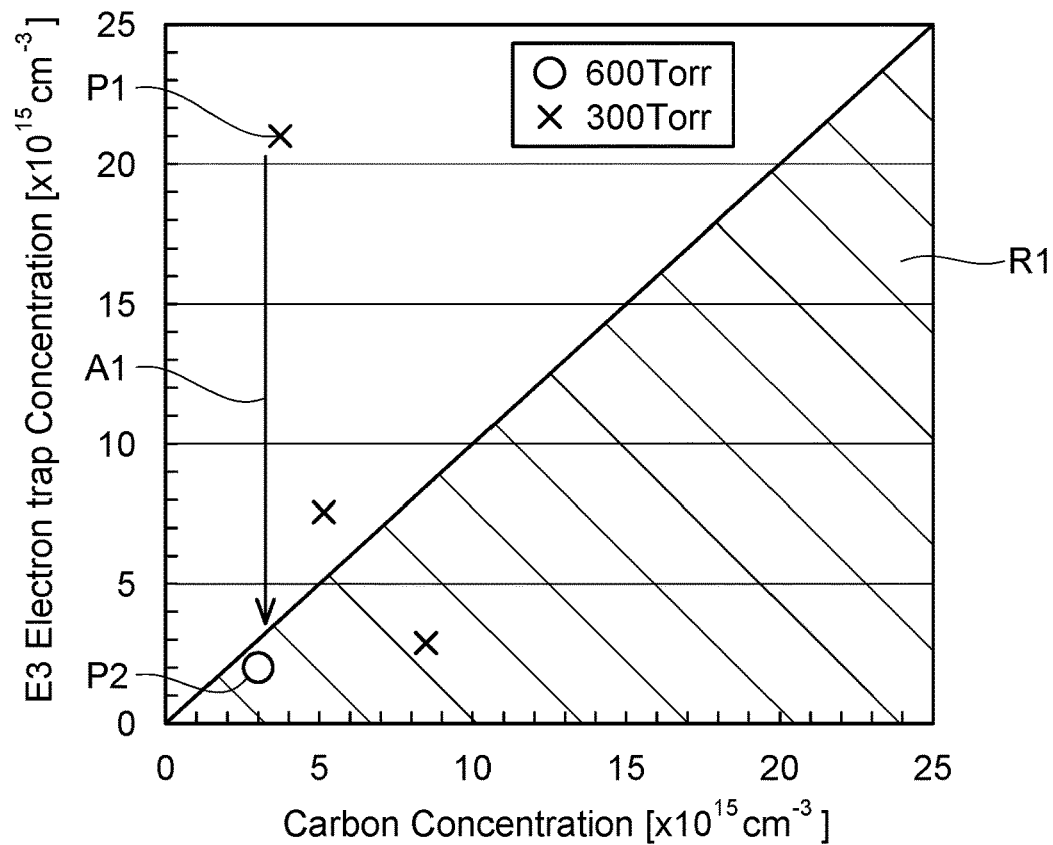
FIG. 4 is a graph showing a relationship between the carbon concentration and an E3 electron trap concentration.

As the third problem, if the carbon concentration in GaN is reduced, the E3 electron trap concentration increases. Since the E3 electron traps also serve as acceptors, an influence of the E3 electron trap concentration becomes nonignorable when it becomes higher than the carbon concentration, and the on-resistance of the semiconductor device increases. Further, a relationship of the carbon concentration and the E3 electron trap concentration in GaN is shown in the graph of FIG. 4. Cross marks indicate measurement points for a case where the GaN growth pressure is 300 Torr. A white circle mark indicates a measurement point for a case where the GaN growth pressure is 600 Torr. In FIG. 4, when the measurement points (crossed marks) for the case where the GaN growth pressure is 300 Torr are given attention, it can be understood therefrom that the E3 electron trap concentration tends to increase when the carbon concentration is reduced.

In the semiconductor device 1 according to the first embodiment, the blocking voltage at the pn junction between the first drift layer 13 and the p-type layer 14 can be increased due to the donor concentration in the first drift layer 13 being lower than the donor concentration in the second drift layer 12. Further, the electron compensation caused by the compensating acceptors occurs less in the first drift layer 13 than in the second drift layer 12 due to the carbon concentration in the first drift layer 13 being lower than the carbon concentration in the second drift layer 12. As such, a situation in which the on-resistance of the first drift layer 13 becoming increased can be avoided even if the donor concentration in the first drift layer 13 is made lower than the donor concentration in the second drift layer 12. In the drift layer as a whole including both the second drift layer 12 and the first drift layer 13. the on-resistance can be reduced. The aforementioned first problem can be resolved.

In the semiconductor device 1 according to the first embodiment, the growth speed of the second drift layer 12 can be increased than the growth speed of the first drift layer 13 due to the carbon concentration in the second drift layer 12 being higher than the carbon concentration in the first drift layer 13. Further, the thickness TH2 of the second drift layer 12 is thicker than the thickness TH1 of the first drift layer 13. That is, in the drift layer as a whole including both the second drift layer 12 and the first drift layer 13, a ratio occupied by the second drift layer 12 having the higher growth speed is greater. Due to this, the growth speed of the drift layer as a whole can be shortened. The aforementioned second problem can be resolved.

In the semiconductor device 1 according to the first embodiment, the growth pressure for growing the second drift layer 12 and the first drift layer 13 is set to a predetermined pressure (such as 500 Torr). The effect achieved hereby will be described with reference to FIG. 4. In FIG. 4, a region R1 in which the E3 electron trap concentration becomes lower than the carbon concentration is shown by oblique lines. Under a condition with a low carbon concentration ($5 \times 10^{15}$ cm$^{-3}$ or less), a measurement point P1 for the case where the growth pressure is equal to or less than the predetermined pressure, being 300 Torr, is outside the region R1. On the other hand, a measurement point P2 for the case where the growth pressure is equal to or greater than the predetermined pressure, being 600 Torr, is within the region R1. That is, a state where the E3 electron trap concentration is lower than the carbon concentration can be realized as shown by an arrow A1 of FIG. 4 by using the growth pressure that is equal to or greater than the predetermined pressure. As described above, the E3 electron trap concentration can be made lower than the carbon concentration in the second drift layer 12 and the E3 electron trap concentration can be made lower than the carbon concentration in the first drift layer 13 as well. A situation in which the on-resistance of the semiconductor device 1 becomes high due to the E3 electron trap can be avoided. The aforementioned third problem can be resolved. Further, since the donor concentration is higher in the second drift layer 12 than in the first drift layer 13, a tolerated carbon concentration can also be made higher in the second drift layer 12 than in the first drift layer 13. As a result, the E3 electron trap concentration in the second drift layer 12 can be suppressed low, by which a situation in which the on-resistance of the second drift layer 12 becomes high can be avoided. The aforementioned third problem can be resolved.

(Measurements of Carbon Concentration and E3 Electron Trap Concentration)

The carbon concentration and the E3 electron trap concentration can be measured in a cross section of a semiconductor device. Due to this, a determination on whether or not a semiconductor device being a measurement target has a structure corresponding to the second drift layer 12 and the first drift layer 13 disclosed herein can be made based thereon. Specific details will be described below.

The carbon concentration can be measured by a secondary ion mass spectrometry method. Detailed description thereof will be omitted. since a known method may be employed.

Figure 5:
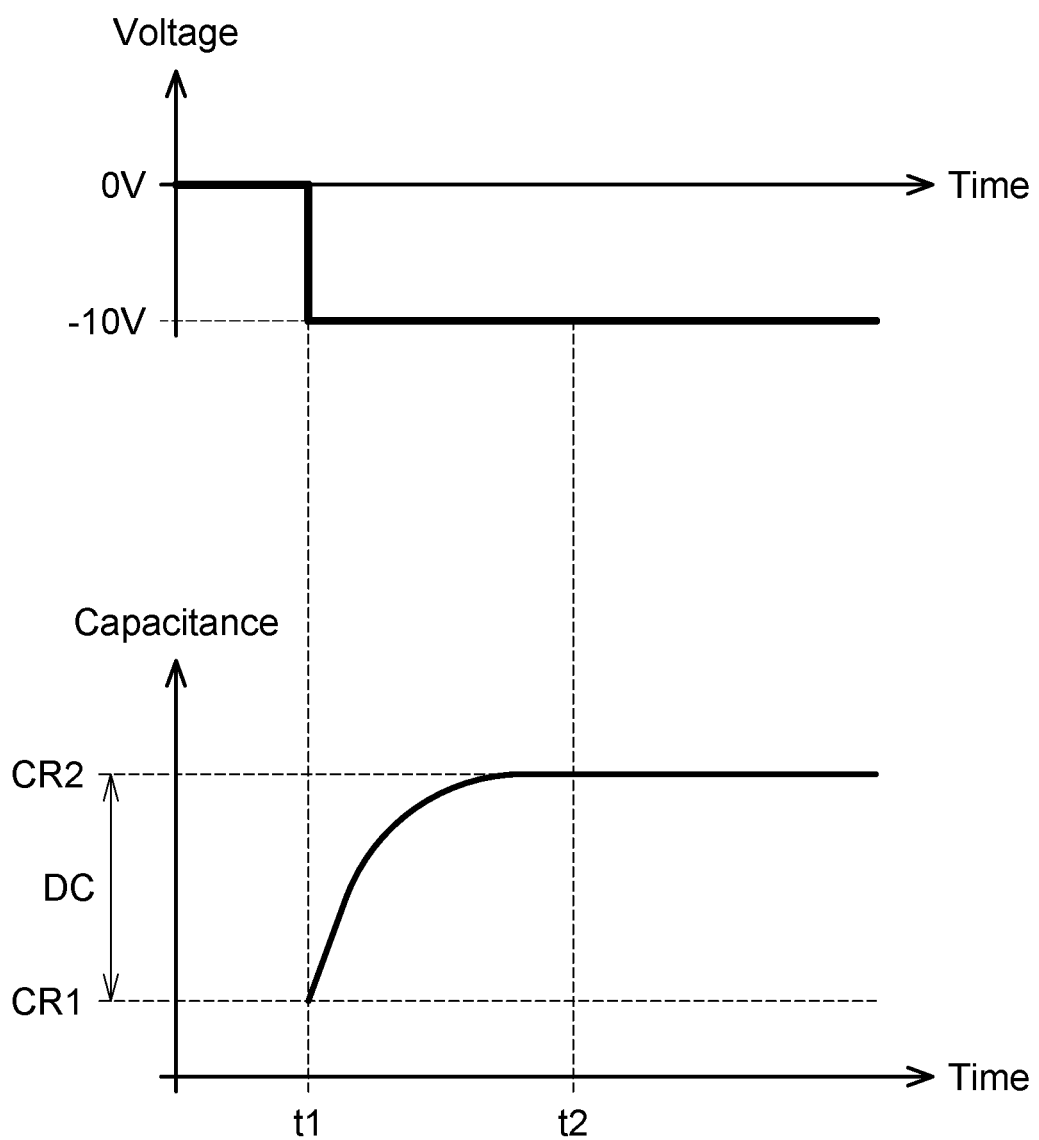
FIG. 5 is a graph showing a measurement example of the E3 electron trap concentration.

The E3 electron trap concentration can be measured by isothermal capacitance transient spectroscopy (ICTS) on a diode at room temperature. The E3 electron trap has the energy level of 0.6 eV from the conduction band minimum. Thus. it requires a time period of a few hundred millisecond to discharge electrons trapped by the E3 electron trap at room temperature by applying the reverse bias voltage. As shown in FIG. 5, a case where the reverse bias voltage of −10V is applied at time t1 will be considered. A depletion layer capacitance per unit area at time t1 is set as CR1. Further. a depletion layer capacitance per unit area at time t2, which is after a sufficient time has elapsed from time t1, is set as CR2. At time t1, the E3 electron trap has the electrons trapped, so the depletion layer capacitance CR1 at time t1 is smaller than the depletion layer capacitance CR2 by a capacitance difference DC. The E3 electron trap concentration can be calculated from the depletion layer capacitance CR2 and the chronological change in the capacitance difference DC.

Second Embodiment (Configuration of Semiconductor Device 100)

Figure 6:
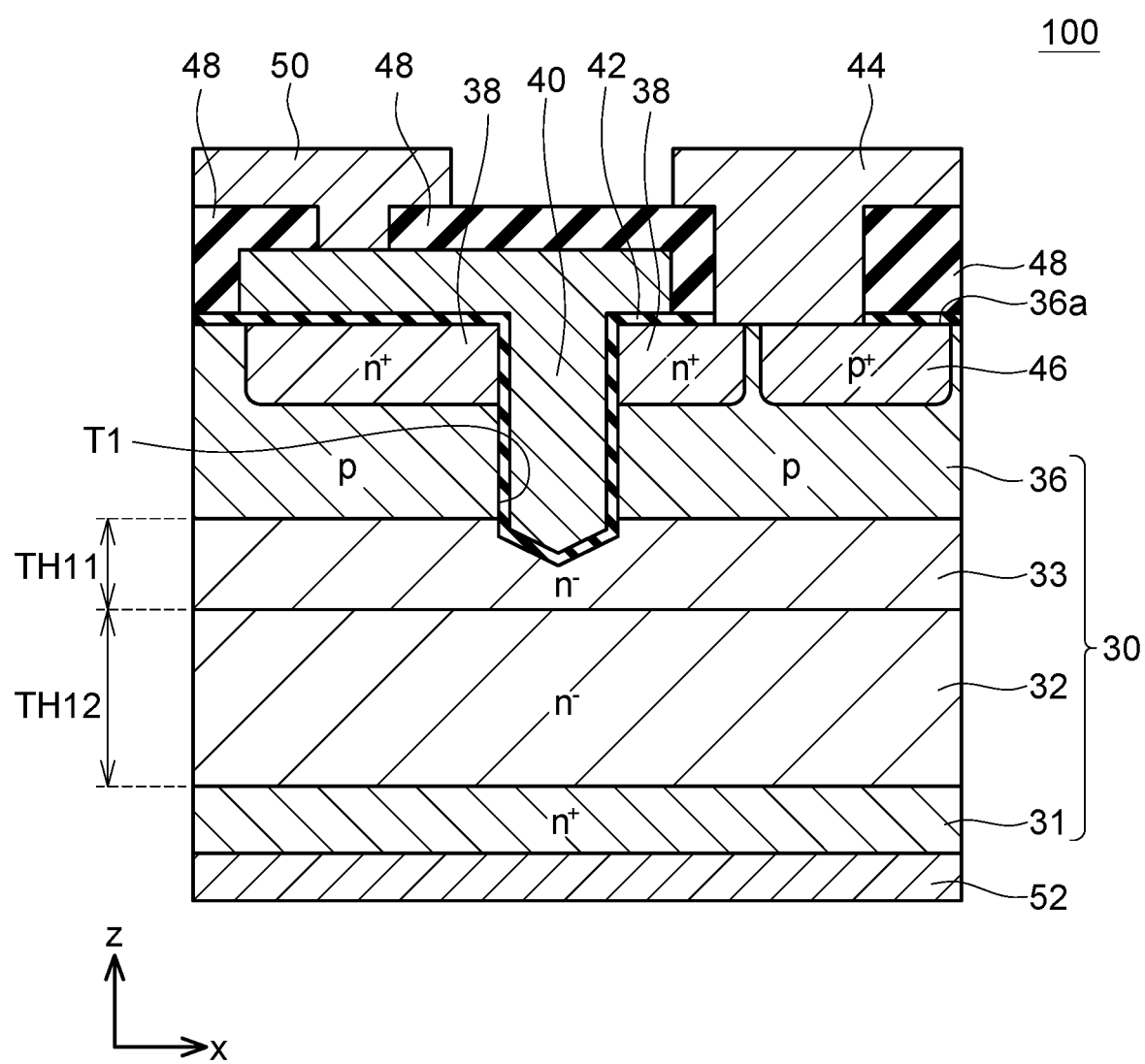
FIG. 6 is a schematic cross-sectional view of a semiconductor device 100 according to a second embodiment.

FIG. 6 shows a cross-sectional view of a semiconductor device 100 according to a second embodiment. The semiconductor device 100 is a vertical MOSFET provided with a trench gate. The semiconductor device 100 includes a semiconductor substrate 30. The semiconductor substrate 30 has a laminate structure in which a buffer layer 31, a second drift layer 32, a first drift layer 33, and a body layer 36 are laminated.

The buffer layer 31 is an n$^+$-type GaN substrate. A function of the buffer layer 31 is same as the function of the buffer layer 11 described in the first embodiment. A drain electrode 52 is provided on a bottom surface of the buffer layer 31. The second drift layer 32 is provided on an upper surface of the buffer layer 31. The first drift layer 33 is provided on an upper surface of the second drift layer 32. The second drift layer 32 and the first drift layer 33 are type GaN layers that are epitaxially grown. A thickness TH12 of the second drift layer 32 is thicker than a thickness TH11 of the first drift layer 33. Characteristics such as donor densities, carbon densities, and E3 electron trap densities in the second drift layer 32 and the first drift layer 33 are same as those of the second drift layer 12 and the first drift layer 13 described in the first embodiment. Thus. the descriptions thereof will be omitted. The body layer 36 is a p-type GaN layer epitaxially grown on the second drift layer 32. A body contact region 46 being p$^+$-type GaN and a source region 38 being n$^+$-type GaN are disposed in the body layer 36.

A trench gate electrode 40 penetrates the source region 38 and the body layer 36 from an upper surface 36a of the body layer 36 and enters into the first drift layer 33. The trench gate electrode 40 is an electrode provided in a trench T1 having its side and bottom surfaces covered by a gate insulating film 42. The trench gate electrode 40 extends outside the trench T1 and is in contact with a gate electrode 50. The trench gate electrode 40 is constituted of amorphous silicon or the like. The interlayer insulating film 48 is a layer for ensuring insulation between the gate electrode 50 and a source electrode 44. The source electrode 44 contacts upper surfaces of the body contact region 46 and the source region 38.

In the semiconductor device 100 having such second drift layer 32 and first drift layer 33, same effects as those of the semiconductor device 1 according to the first embodiment can be achieved.

Third Embodiment (Configuration of Semiconductor Device 200)

Figure 7:
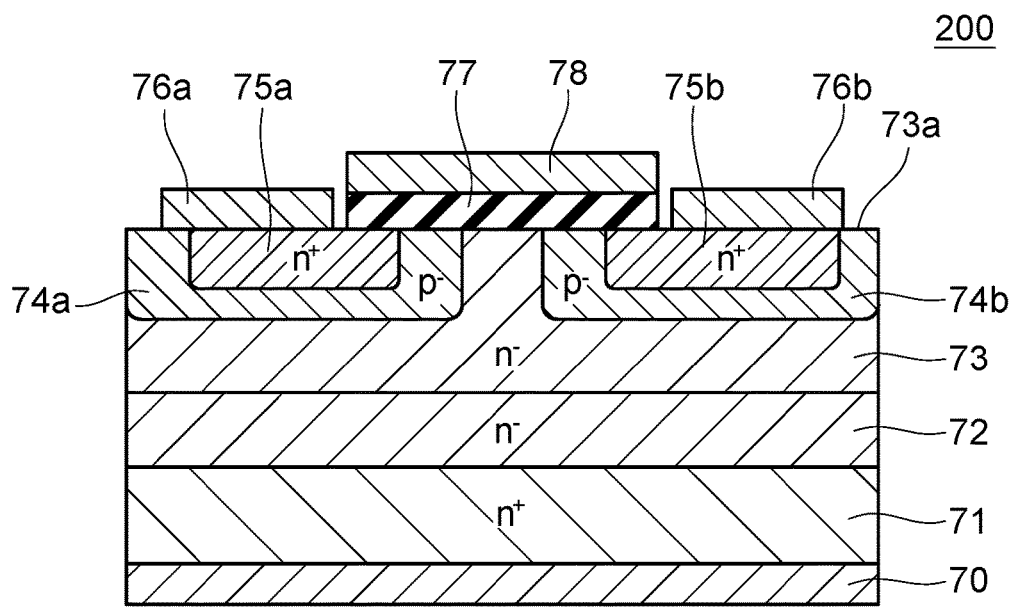
FIG. 7 is a schematic cross-sectional view of a semiconductor device 200 according to a third embodiment.

FIG. 7 shows a schematic cross-sectional view of a semiconductor device 200 according to a third embodiment. The semiconductor device 200 is a vertical MOSFET provided with a planar gate. A buffer layer 71 is an n$^+$-type GaN substrate. A function of the buffer layer 71 is same as the function of the buffer layer 11 described in the first embodiment. A drain electrode 70 is provided on a bottom surface of the buffer layer 71. A second drift layer 72 being an n$^-$-type GaN layer is provided on an upper surface of the buffer layer 71. A first drift layer 73 being an n$^-$-type GaN layer is provided on an upper surface of the second drift layer 72. Body regions 74a and 74b are p$^-$-type conductive regions obtained by implanting magnesium ions from an upper surface 73a of the first drift layer 73 and heat-treating the same. Source regions 75a and 75b are n$^+$-type conductive regions obtained by implanting silicon from the upper surface 73a. Source electrodes 76a, 76b are in contact with upper surfaces of the source regions 75a, 75b. Further, a gate electrode 78 is provided via a gate insulating film 77 on upper surfaces of the source regions 75a and 75b, the body regions 74a and 74b. and the first drift layer 73.

In the semiconductor device 200 having such second drift layer 72 and first drift layer 73. same effects as those of the semiconductor device 1 according to the first embodiment can be achieved.

Fourth Embodiment (Configuration of Semiconductor Device 1A)

Figure 8:
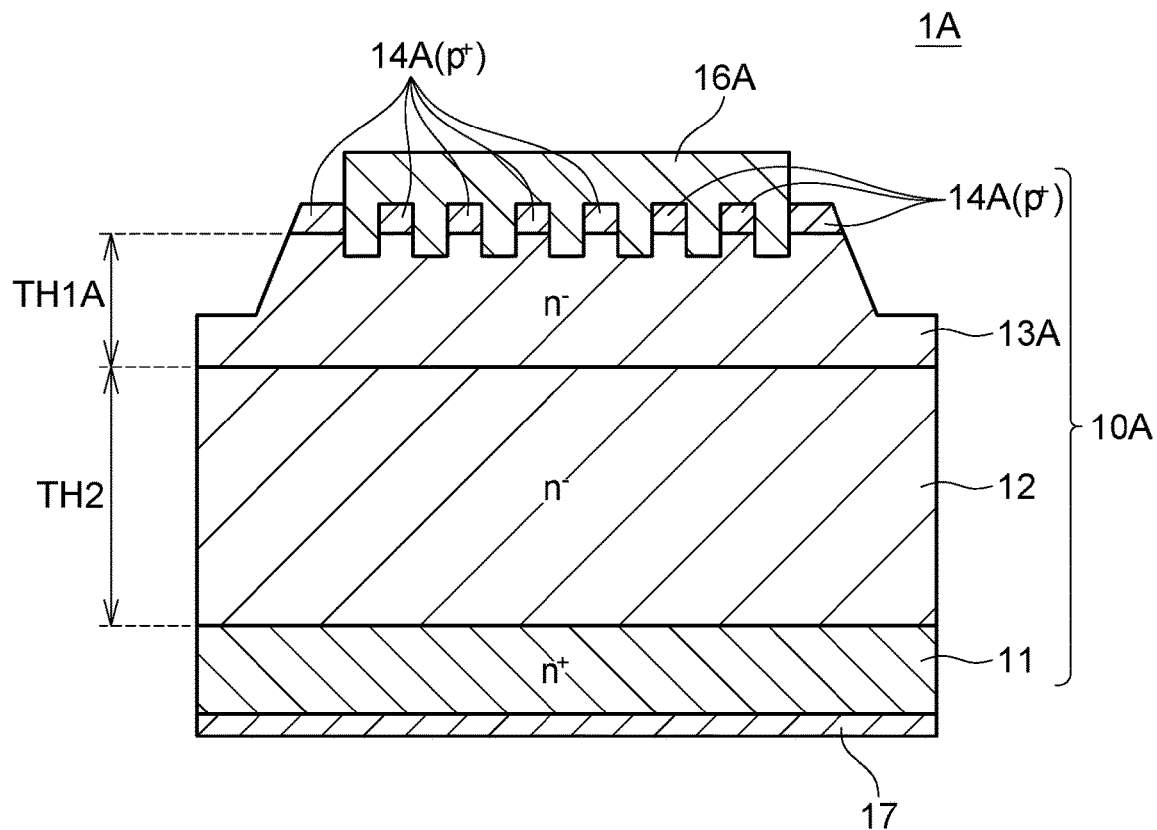
FIG. 8 is a schematic cross-sectional view of a semiconductor device 1A according to a fourth embodiment.

FIG. 8 shows a cross-sectional view of a semiconductor device 1A according to a fourth embodiment. The semiconductor device 1A is a pn junction power diode provided with a JBS (junction barrier Schottky) structure. The semiconductor device 1A according to the fourth embodiment is different from the semiconductor device 1 according to the first embodiment in structures of a first drift layer 13A, p-type layers 14A, and an anode electrode 16A. In the description below, the configuration that are same between the semiconductor device 1A according to the fourth embodiment and the semiconductor device 1 according to the first embodiment are given same reference signs, and descriptions thereof will be omitted.

A plurality of p-type layers 14A is provided on an upper surface of the first drift layer 13A at a predetermined interval. The p-type layers 14A are p$^+$-type GaN layers. The anode electrode 16A connects with the first drift layer 13a via regions between adjacent p-type layers 14A. Further, a thickness TH2 of the second drift layer 12 is thicker than a thickness TH1A of the first drift layer 13A. Characteristics such as donor densities, carbon densities, and E3 electron trap densities in the second drift layer 12 and the first drift layer 13A in the fourth embodiment are same as those of the second drift layer 12 and the first drift layer 13 described in the first embodiment.

In the semiconductor device 1A (JBS diode), depletion layers spread and pinch off between the adjacent p-type layers 14A when a reverse bias is applied, by which leak current can be suppressed. In the semiconductor device 1A having such second drift layer 12 and first drift layer 13A. same effects as those of the semiconductor device 1 according to the first embodiment can be achieved.

While specific embodiments of the present invention have been described in detail above, such description is for illustrative purposes only and is not intended to limit the scope and claims of the invention. Techniques described in the claims of the invention include various modifications and changes made to the specific examples illustrated above. Furthermore, it is to be understood that the technical elements described in the present specification and the drawings exhibit technical usefulness solely or in various combinations thereof and shall not be limited to the combinations described in the claims at the time of filing. The techniques illustrated in the present specification and the drawings are to achieve a plurality of objectives at the same time, and technical usefulness is exhibited by attaining any one of such objectives.

Variant

A case where the carbon concentration in the first drift layer 13 is at the first concentration and constant was described, however, no limitation is made to this configuration. For example, the carbon concentration in the first drift layer 13 may increase as a distance from the interface between the first drift layer 13 and the p-type layer 14 increases. This may be implemented for example by setting the V/III ratio to increase stepwise (that is, decrease a material supply amount of TMGa stepwise) upon growing the first drift layer 13 in step S3.

In step S1, the step of forming the buffer layer 11 may be omitted.

The group III nitride semiconductor constituting the semiconductor substrate 10 is not limited to GaN, and for example. it maybe AlN (aluminum nitride), InN (indium nitride), or mixed crystal(s) thereof.

In the above embodiments, magnesium (Mg) is used as an example of a group II element for constituting p-type regions, however, no limitation is made to such a configuration. The group II element may for example be beryllium (Be) or calcium (Ca).

The first drift layer 13 is an example of a first n-type voltage-blocking layer. The second drift layer 12 is an example of a second n-type voltage-blocking layer.

What is claimed is:

1. A nitride semiconductor device comprising:
   a p-type layer;
   a first n-type voltage-blocking layer in contact with the p-type layer; and
   a second n-type voltage-blocking layer in contact with the first n-type voltage-blocking layer and separated from the p-type layer by the first n-type voltage-blocking layer,
   wherein a donor concentration in the first n-type voltage-blocking layer is lower than a donor concentration in the second n-type voltage-blocking layer, and
   a carbon concentration in the first n-type voltage-blocking layer is lower than a carbon concentration in the second n-type voltage-blocking layer.

2. The nitride semiconductor device according to claim 1, wherein
   the carbon concentration in the first n-type voltage-blocking layer is constant and is at a first concentration,
   the carbon concentration in the second n-type voltage-blocking layer is constant and is at a second concentration, and
   the first concentration is lower than the second concentration.

3. The nitride semiconductor device according to claim 1, wherein the carbon concentration in the first n-type voltage-blocking layer becomes higher as a distance from an interface between the first n-type voltage-blocking layer and the p-type layer increases.

4. The nitride semiconductor device according to claim 1, wherein an E3 electron trap concentration in the first n-type voltage-blocking layer is lower than the carbon concentration in the first n-type voltage-blocking layer, and an E3 electron trap concentration in the second n-type voltage-blocking layer is lower than the carbon concentration in the second n-type voltage-blocking layer.

5. The nitride semiconductor device according to claim 1, wherein a thickness of the second n-type voltage-blocking layer is thicker than a thickness of the first n-type voltage-blocking layer.

6. A method of manufacturing a nitride semiconductor device provided with a p-type layer, a first n-type voltage-blocking layer, and a second n-type voltage-blocking layer, the method comprising:

forming the second n-type voltage-blocking layer on a nitride semiconductor substrate by an epitaxial growth method;

forming the first n-type voltage-blocking layer in contact with the second n-type voltage-blocking layer by the epitaxial growth method; and forming the p-type layer in contact with the first n-type voltage-blocking layer and separated from the second n-type voltage-blocking layer by the first n-type voltage-blocking layer, wherein a growth rate of the second n-type voltage-blocking layer is higher than a growth rate of the first n-type voltage-blocking layer.

7. The method of manufacturing a nitride semiconductor device according to claim 6, wherein the epitaxial growth method is a metalorganic vapor growth method, and a V/III ratio in growing the second n-type voltage-blocking layer is lower than a V/III ratio in growing the first n-type voltage-blocking layer.

8. The nitride semiconductor device according to claim 1, wherein a growth rate of the second n-type voltage-blocking layer is higher than a growth rate of the first n-type voltage-blocking layer.

9. The method of manufacturing a nitride semiconductor device according to claim 6, wherein a carbon concentration in the first n-type voltage-blocking layer is lower than a carbon concentration in the second n-type voltage-blocking layer.

* * * * *